United States Patent
Kushnarenko

(12) 
(10) Patent No.: US 6,351,415 B1
(45) Date of Patent: Feb. 26, 2002

(54) SYMMETRICAL NON-VOLATILE MEMORY ARRAY ARCHITECTURE WITHOUT NEIGHBOR EFFECT

(75) Inventor: Alexander Kushnarenko, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/821,336

(22) Filed: Mar. 28, 2001

(51) Int. Cl.[7] .............................................. G11C 16/04
(52) U.S. Cl. ............................ 365/185.18; 365/185.03; 365/185.05; 365/63
(58) Field of Search ....................... 365/185.18, 185.03, 365/185.05, 63, 185.16, 185.17

(56) References Cited

U.S. PATENT DOCUMENTS 5,963,465 A    10/1999   Eitan ........................... 365/63
6,157,570 A  * 12/2000   Nachumovsky ........ 365/185.18

* cited by examiner

Primary Examiner—Viet Q. Nguyen
Assistant Examiner—David Lam
(74) Attorney, Agent, or Firm—E. Eric Hoffman; Law Offices of Bever, Hoffman & Harms, LLP

(57) ABSTRACT

A method is provided for reading a first non-volatile memory transistor in an array of non-volatile memory transistors, wherein the first non-volatile memory transistor has a drain coupled to a source of a neighbor non-volatile memory transistor. The method includes the steps of (1) applying a read voltage to the gates of the first and neighbor non-volatile memory transistors, (2) applying a source voltage (Vs) to a source of the first non-volatile memory transistor, (3) applying a drain voltage (Vd) to the drain of the first non-volatile memory transistor and the source of the neighbor non-volatile memory transistor, and (4) applying a forcing voltage (Vf) to a drain of the neighbor non-volatile memory transistor. In a particular embodiment, the drain voltage Vd is equal to the forcing voltage Vf. Another embodiment includes the step of applying a second forcing voltage (Vfs) to the source of another neighbor non-volatile memory transistor.

19 Claims, 5 Drawing Sheets

| | READ 201 | READ 202 | READ 203 | READ 204 | READ 205 | READ 206 | READ 301 | READ 302 | READ 303 | READ 304 | READ 305 |
|---|---|---|---|---|---|---|---|---|---|---|---|
| MBL[0] | Vd | Vf | Vs | Vd | Vf | FLOAT | FLOAT | FLOAT | FLOAT | FLOAT | FLOAT |
| MBL[1] | Vs | Vd | Vf | Vs | Vd | Vf | FLOAT | FLOAT | FLOAT | FLOAT | FLOAT |
| MBL[2] | FLOAT | Vs | Vd | Vf | Vs | Vd | Vf | FLOAT | FLOAT | FLOAT | FLOAT |
| MBL[3] | FLOAT | FLOAT | FLOAT | FLOAT | FLOAT | Vs | Vd | Vf | Vs | Vd | Vf |
| MBL[4] | FLOAT | FLOAT | FLOAT | FLOAT | FLOAT | FLOAT | Vs | Vd | Vf | Vs | Vd |
| MBL[5] | FLOAT | FLOAT | FLOAT | FLOAT | FLOAT | FLOAT | FLOAT | Vs | Vd | Vf | Vs |
| SEL[0] | HIGH | HIGH | LOW | LOW | LOW | HIGH | HIGH | HIGH | LOW | LOW | LOW |
| SEL[1] | LOW | LOW | HIGH | HIGH | HIGH | LOW | LOW | LOW | HIGH | HIGH | HIGH |
| SEL[2] | LOW | HIGH | HIGH | HIGH | LOW | LOW | LOW | HIGH | HIGH | HIGH | LOW |
| SEL[3] | HIGH | LOW | LOW | LOW | HIGH | HIGH | HIGH | LOW | LOW | LOW | HIGH |
| SEL[4] | LOW | HIGH | HIGH | LOW | LOW | HIGH | LOW | HIGH | LOW | LOW | LOW |
| SEL[5] | LOW | LOW | LOW | HIGH | HIGH | HIGH | LOW | LOW | LOW | HIGH | HIGH |

FIG. 3

SYMMETRICAL NON-VOLATILE MEMORY ARRAY ARCHITECTURE WITHOUT NEIGHBOR EFFECT

FIELD OF THE INVENTION

The present invention relates to a non-volatile memory architecture. More specifically, the present invention relates to a symmetric non-volatile memory architecture that eliminates neighbor effect and does not require bit line pre-charge or pre-discharge.

RELATED ART

FIG. 1 is a circuit diagram of a conventional non-volatile memory array 100. This array 100 includes non-volatile memory cells 101–114, select transistors 121–128, metal bit lines 131–134, diffusion bit lines 141–148, and word lines 151–152. As suggested by their names, metal bit lines 131–134 are formed by metal interconnect lines formed over a semiconductor substrate, and diffusion bit lines 141–148 are formed by conductively doped diffusion regions in the semiconductor substrate. The various elements of non-volatile memory array 100 are described in more detail in U.S. Pat. No. 5,963,465 by Eitan, entitled "Symmetric Segmented Memory Array Architecture".

A critical parameter of non-volatile memory array 100 is the area that it occupies in the semiconductor substrate. Non-volatile memory array 100 is therefore designed to occupy a minimum area in the substrate. Additional rows of non-volatile memory transistors can be added to expand array 100 along the vertical axis. In addition, the structure of memory cells 101–104, 107–110, diffusion bit lines 141–144, select transistors 121–124 and metal bit lines 131–132, which is shown in dashed lines, can be repeated to expand array 100 along the horizontal axis.

The non-volatile memory transistors of array 100 are accessed through select transistors 121–128. For example, non-volatile memory transistor 102 is read as follows. Select signals SEL[1] and SEL[2] are asserted high, thereby turning on select transistors 122 and 123. As a result, metal bit line 131 is coupled to diffusion bit line 143, and metal bit line 132 is coupled to diffusion bit line 142. A source read voltage Vs is applied to diffusion bit line 143 through select transistor 122 and metal bit line 131. A drain read voltage Vd is applied to diffusion bit line 142 through select transistor 123 and metal bit line 132. Word line signal WL[0] is asserted high, thereby applying a logic high voltage to the gates of non-volatile memory transistors 101–107. Under these conditions, read current flows from metal bit line 132 to metal bit line 131 through transistor 102, with the magnitude of the read current depending on the threshold voltage of transistor 102. The read current is measured to provide information concerning the threshold voltage of transistor 102 (i.e., to determine whether transistor 102 is in a programmed or erased state).

During a read of non-volatile transistor 102, the current through transistor 102 is not protected from current that may flow to or from diffusion bit lines 141 and 144 through neighboring non-volatile transistors 101 and 103, respectively. This is referred to as "neighbor effect".

For example, during a read of transistor 102, current can flow between diffusion bit lines 141 and 142 through neighbor transistor 101. Similarly, current can flow between diffusion bit lines 143 and 144 through neighbor transistor 103. The current flow through neighbor transistors 101 and 103 will depend on the threshold voltages of these transistors (i.e., whether these transistors 101 and 103 are programmed or erased). The measured read current of transistor 102 will be lower if a neighboring diffusion bit line is discharged, or higher if a neighboring diffusion bit line is charged. The neighbor effect can corrupt the read determination of the read transistor 102. Consequently, the diffusion bit lines of array 100 are typically pre-charged or pre-discharged prior to a read operation.

It would therefore be desirable to have a symmetric array that does not experience the neighbor effect, and does not require a pre-charge or pre-discharge operation.

SUMMARY

Accordingly, the present invention provides a symmetric non-volatile memory array and method of operating that eliminates the neighbor effect, and does not require bit line pre-charge or pre-discharge.

More specifically, a method is provided for reading a first non-volatile memory transistor in an array of non-volatile memory transistors, wherein the first non-volatile memory transistor has a drain coupled to the source of a second non-volatile memory transistor. The method includes the steps of (1) applying a read voltage to the gates of the first and second memory transistors, (2) applying a source voltage (Vs) to the source of the first memory transistor, (3) applying a drain voltage (Vd) to the drain of the first memory transistor and the source of the second memory transistor, and (4) applying a forcing voltage (Vf) to the drain of the second memory transistor.

In a particular embodiment, the drain voltage Vd is equal to the forcing voltage Vf. As a result, no read current will flow through the second memory transistor during a read of the first memory transistor. In addition, the source voltage Vs can be set to 0 Volts, such that another memory transistor, coupled to the source of the first transistor, will not disturb the read current through the first memory transistor. As a result, it is not necessary to pre-charge or pre-discharge bit lines of the array prior to a read operation.

In another embodiment, a non-volatile memory architecture is provided to allow the drain voltage Vd, the source voltage Vs and the forcing voltage Vf, to be applied to the non-volatile memory transistors in an array. In one embodiment, this array includes a first non-volatile memory transistor having a drain coupled to a first bit line, a second non-volatile memory transistor having a drain coupled to a second bit line and to the source of the first non-volatile memory transistor, and a third non-volatile memory transistor having a drain coupled to a third bit line and to the source of the second non-volatile memory transistor. In addition, means are provided to allow the forcing voltage Vf to be applied to the first bit line, the drain voltage Vd to be applied to the second bit line, and a second read voltage to be applied to the third bit line in order to perform a read operation of the second non-volatile memory transistor.

Each of the bit lines can include a diffusion bit line located in a semiconductor substrate, and a metal bit line located over the semiconductor substrate and coupled to the diffusion bit line. In one embodiment, a select transistor is coupled between each metal bit line and a corresponding diffusion bit line.

In another embodiment, a non-volatile memory architecture includes an array of non-volatile memory transistors arranged in rows and columns. A plurality of diffusion bit lines are provided, wherein each diffusion bit line is coupled to the drain of each transistor in one column of the array and the source of each transistor in an adjacent column of the array. A plurality of metal bit lines and a plurality of select transistors are also provided. Each metal bit line is coupled to a dedicated pair of select transistors, wherein one of the select transistors is coupled to one of the diffusion bit lines, and the other select transistor is coupled to another one of the diffusion bit lines, wherein the diffusion bit lines are separated by two other diffusion bit lines. This spacing enables the forcing voltage Vf, the drain voltage Vd and the source voltage Vs to be applied in an efficient manner.

Another embodiment of the present invention provides a method for reading a first non-volatile memory transistor in an array of non-volatile memory transistors, wherein the first non-volatile memory transistor has a drain coupled to the source of a second non-volatile memory transistor, and a source coupled to the drain of a third non-volatile memory transistor. The method includes the steps of (1) applying a read voltage to the gates of the first, second and third memory transistors, (2) applying a source voltage (Vs) to the source of the first memory transistor and the drain of the third memory transistor, (3) applying a drain voltage (Vd) to the drain of the first memory transistor and the source of the second memory transistor, (4) applying a first forcing voltage (Vf) to the drain of the second memory transistor; and (5) applying a second forcing voltage (Vfs) to the source of the third memory transistor.

The present invention will be more fully understood in view of the description and drawings provided below.

BRIEF DESCRIPTION OF THE DRAWINGS

FIG. 3 is a table that defines bit line voltages and select voltages used to read non-volatile memory transistors of the array of FIG. 2 in accordance with one embodiment of the present invention.

DETAILED DESCRIPTION

Figure 1:
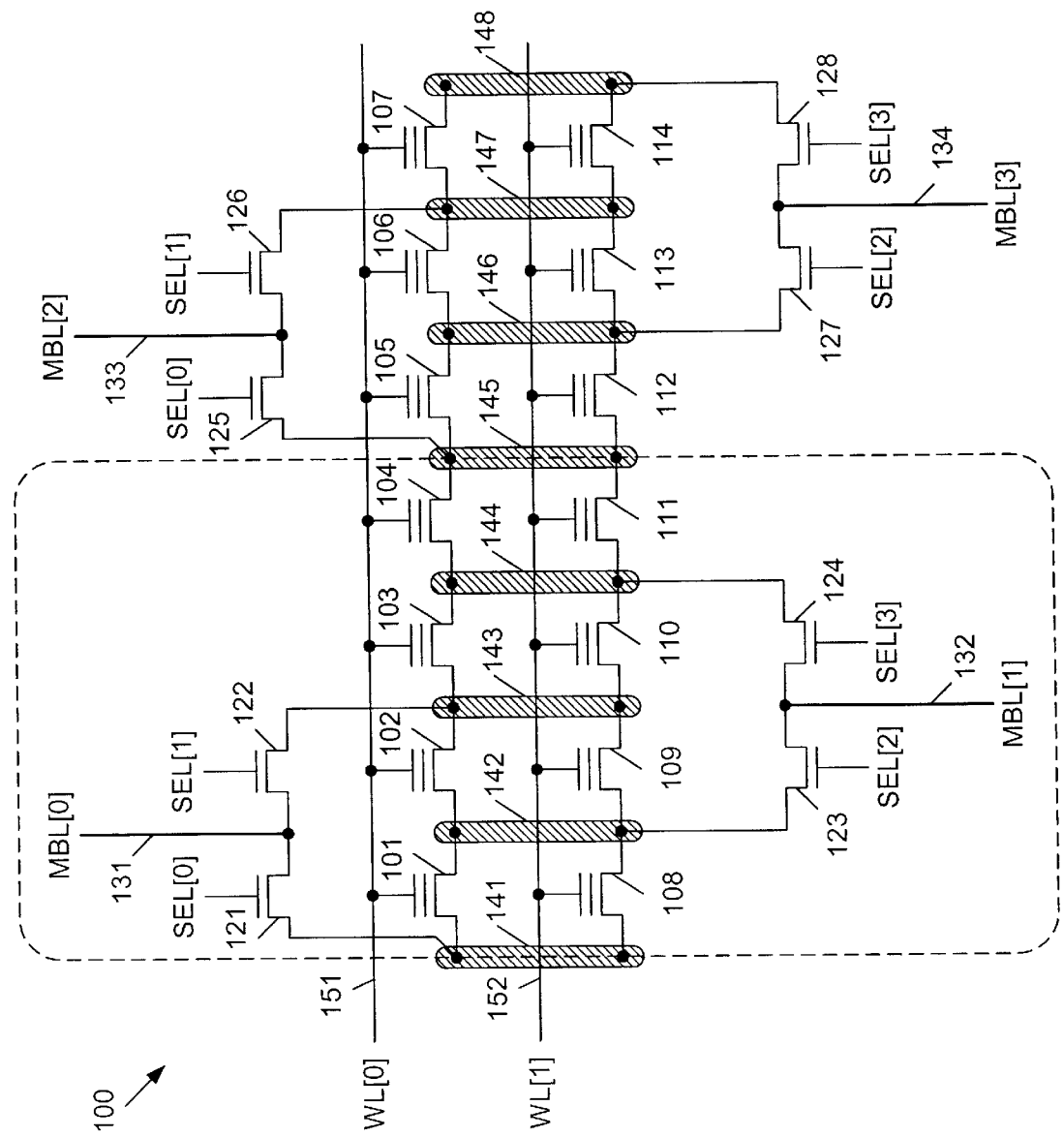
FIG. 1 is a circuit diagram of a conventional high-density non-volatile memory array which experiences neighbor effect.
Figure 2:
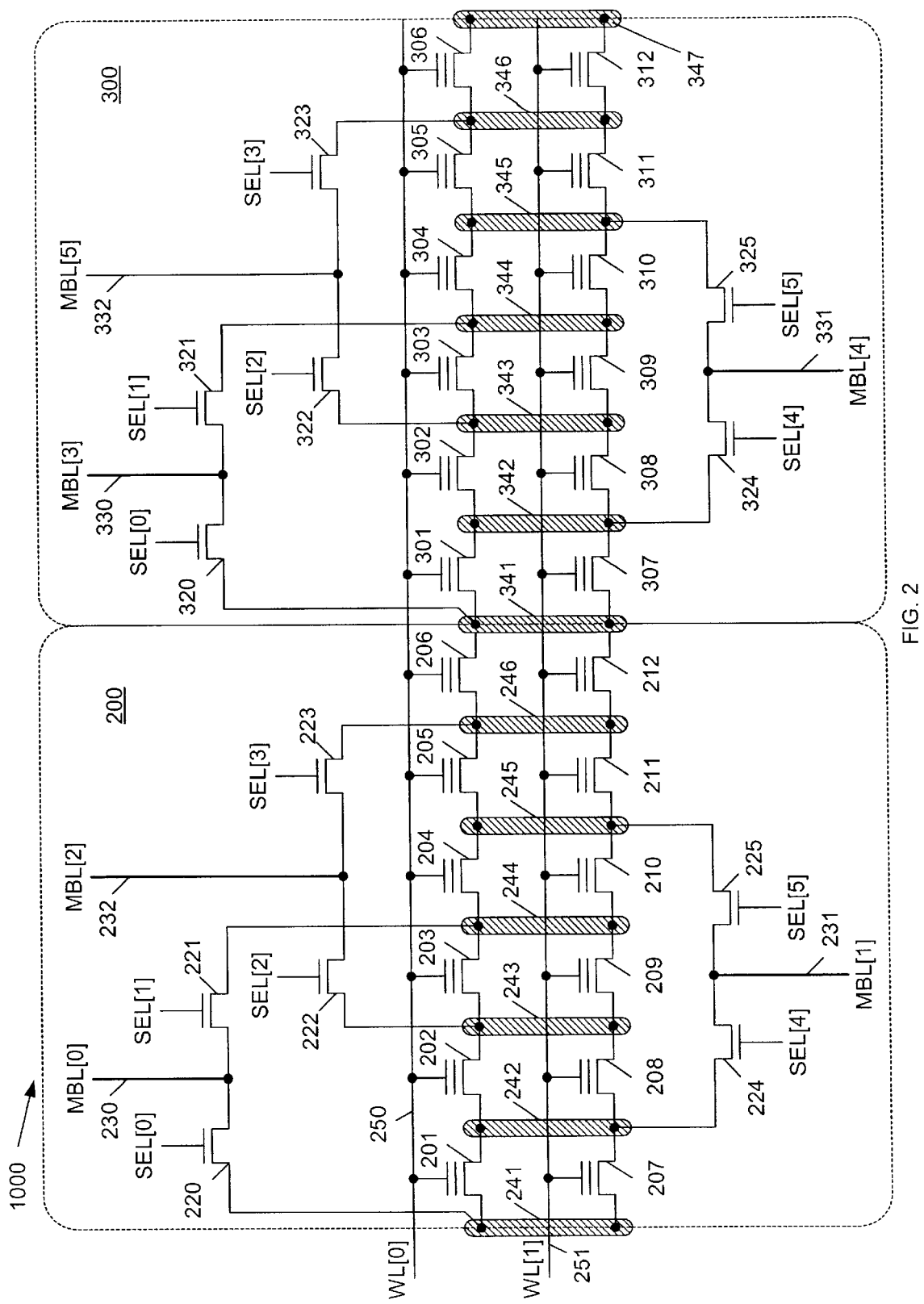
FIG. 2 is a circuit diagram of a symmetrical non-volatile memory array in accordance with one embodiment of the present invention.

FIG. 2 is a circuit diagram of a symmetrical non-volatile memory array 1000 in accordance with one embodiment of the present invention. Array 1000 includes a pair of repeatable memory tiles 200 and 300. Memory tile 200 includes non-volatile memory transistors 201–212, select transistors 220–225, metal bit lines 230–232, and diffusion bit lines 241–246. Similarly, memory tile 300 includes non-volatile memory transistors 301–312, select transistors 320–325, metal bit lines 330–332, and diffusion bit lines 341–347. Memory tiles 200 and 300 share word lines 250–251 and diffusion bit line 341. The construction of memory tiles 200 and 300 is identical. Thus, array 1000 can easily be expanded along the horizontal axis of FIG. 2 by attaching addition memory tiles identical to tiles 200 and 300. In addition, array 1000 can be expanded along the vertical axis of FIG. 2 by adding additional rows of non-volatile memory transistors, with corresponding word lines. Thus, the present invention is not limited by the size of the array.

Non-volatile memory transistors 201–206 and 301–306 are located in a first row of array 1000. The control gates of transistors 201–206 and 301–306 are coupled to word line 250. Non-volatile memory transistors 207–212 and 307–312 are located in a second row of array 1000. The control gates of transistors 207–212 and 307–312 are coupled to word line 251.

Non-volatile memory array 1000 is fabricated in a semiconductor substrate. Diffusion bit lines 241–246 and 341–347 are formed by conductively doping regions of the semiconductor substrate. In the described embodiment, diffusion bit lines 241–246 and 341–347 extend along the vertical axis of FIG. 2. Each of diffusion bit lines 242–246 and 341–346 is continuous with the source regions of memory transistors in one column of the array, and continuous with the drain regions of memory transistors in an adjacent column of the array. For example, diffusion bit line 243 is continuous with the sources of memory transistors 202 and 208, and with the drains of memory transistors 203 and 209. Similarly, diffusion bit line 244 is continuous with the sources of memory transistors 203 and 209, and with the drains of memory transistors 204 and 210.

Select transistors 220–225 and 320–325, which are fabricated in the semiconductor substrate, are used to couple diffusion bit lines 241–246 and 341–347 to metal bit lines 230–232 and 330–332. More specifically, within memory tile 200, select transistors 220 and 221 couple diffusion bit lines 241 and 244, respectively, to metal bit line 230. Similarly, select transistors 222 and 223 couple diffusion bit lines 243 and 246, respectively, to metal bit line 232. Finally, select transistors 224 and 225 couple diffusion bit lines 242 and 245, respectively, to metal bit line 231. Similar connections are provided between metal bit lines 330–332 and diffusion bit lines 341–346 in memory tile 300.

In accordance with one embodiment of the present invention, methods for fabricating the various elements of array 1000 (i.e., non-volatile memory transistors, diffusion bit lines, metal bit lines and select transistors) are described in commonly owned, co-pending U.S. patent application Ser. No. 09/244,316, which is hereby incorporated by reference in its entirety.

In the described embodiment, non-volatile memory transistors 201–212 and 301–312 are n-channel devices. Thus, if electrons are stored in the floating gate of one of these memory transistors, then this memory transistor will exhibit a relatively high threshold voltage. This condition is referred to as the programmed state. Conversely, if electrons are removed from the floating gate of one of these memory transistors, then this memory transistor will exhibit a relatively low threshold voltage. This condition is referred to as the erased state. Although the steps of programming and erasing non-volatile memory transistors are known to those skilled in the art, details concerning programming and erasing particular non-volatile memory transistors can be found in commonly owned, co-pending U.S. patent application Ser. No. 09/244,529, and U.S. Pat. Nos. 6,081,456 and 6,181,597, which are hereby incorporated by reference.

A read operation of non-volatile memory transistors 202 and 302 will now be described. To read non-volatile memory transistors 202 and 302, a logic high read voltage ($V_{WL}$) is applied to word line 250 as the word line signal WL[0]. For example, this read voltage ($V_{WL}$) can have a value equal to the $V_{cc}$ supply voltage. A logic low voltage, such as ground, is applied to word line 251 as the word line signal WL[1], thereby turning off non-volatile memory transistors 207–212 and 307–312 in the second row.

Logic high select signals SEL[2] and SEL[4] are asserted, thereby turning on select transistors 222 and 224 in memory tile 200, and turning on select transistors 322 and 324 in memory tile 300. A source read voltage Vs is applied to metal bit lines 232 and 332 as the MBL[2] and MBL[5] signals, respectively. The source read voltage Vs is thereby applied to the sources of transistors 202 and 302 through select transistors 222 and 322, respectively. In the described example, the source voltage Vs has a value of ground, or 0 Volts.

A drain read voltage Vd is applied to metal bit lines 231 and 331 as the MBL[1] and MBL[4] signals, respectively. The drain read voltage Vd is thereby applied to the drains of transistors 202 and 302 through select transistors 224 and 324, respectively. In the described example, the drain voltage Vd is a positive voltage of about 2 Volts.

In addition, a logic high select signal SEL[0] is asserted, thereby turning on select transistors 220 and 320. A forcing voltage Vf is applied to metal bit lines 230 and 330, as the MBL[0] AND MBL[3] signals, respectively. The forcing voltage Vf is thereby applied to the drains of transistors 201 and 301 through select transistors 220 and 320, respectively. In the described example, the forcing voltage Vf is set equal to the drain voltage Vd. Thus, in the described example, the forcing voltage Vf is set to a positive voltage of about 2 Volts.

If transistor 202 has a low threshold voltage (i.e., is in the erased condition), then a substantial read current will flow through this transistor. That is, read current will flow from diffusion bit line 242, which is held at 2 Volts, to diffusion bit line 243, which is held at 0 Volts.

Because neighboring diffusion bit line 241 is held at the same voltage as diffusion bit line 242, diffusion bit line 241 does not tend to increase or reduce the read current through transistor 202. That is, even if neighboring transistor 201 has a low threshold voltage, no current will flow through this transistor 201 because the source and drain of this transistor are held at the same voltage. In this manner, transistor 202 is protected from the neighbor effect on the drain side.

Because diffusion bit line 242 is held at the ground supply voltage, any charge on diffusion bit line 244 will not increase or reduce the read current through memory transistor 202. That is, even if neighboring memory transistor 203 has a low threshold voltage, any charge on diffusion bit line 244 will simply be discharged to the ground supply voltage. In this manner, transistor 202 is protected from the neighbor effect on the source side.

In this manner, conditions for sensing the read current through transistor 202 are provided without requiring pre-charge or pre-discharge of the diffusion bit lines in array 1000. As a result, the time required for sensing the state of transistor 202 during a read operation is significantly reduced in comparison with prior art arrays.

Note that if non-volatile memory transistor 202 has a high threshold voltage (i.e., this transistor is programmed), then no significant read current will flow through this transistor 202.

Other non-volatile memory transistors in array 1000 are accessed in the same manner as transistors 202 and 302. Although both transistors 202 and 302 were read in the example described above, either one of transistors 202 and 302 can be read independently. For example, transistor 202 can be read in the manner described above, while metal bit lines 330–332 are left floating, such that transistor 302 is not read.

FIG. 3 is a table 350 that defines the voltages MBL[5:0] and SEL[5:0] used to read memory transistors 201–206 and 301–305. Table 350 assumes a logic high word line signal WL[0] and a logic low word line signal WL[1]. Non-volatile memory transistors 207–212 and 307–311 are read in a manner similar to non-volatile memory transistors 201–206 and 301–305 (but with word line signal WL[1] asserted high and word line signal WL[0] de-asserted low). Note that non-volatile memory transistors 306 and 312 cannot be read in the present embodiment, as there is no memory tile coupled to the right side of memory tile 300. However, if a memory tile were coupled to the right side of memory tile 300, then memory transistors 306 and 312 would be read in the same manner as memory transistors 206 and 212. The voltages listed in table 350 take into consideration the possible expansion of array 1000 to include memory tiles to the left and right.

Figure 4:
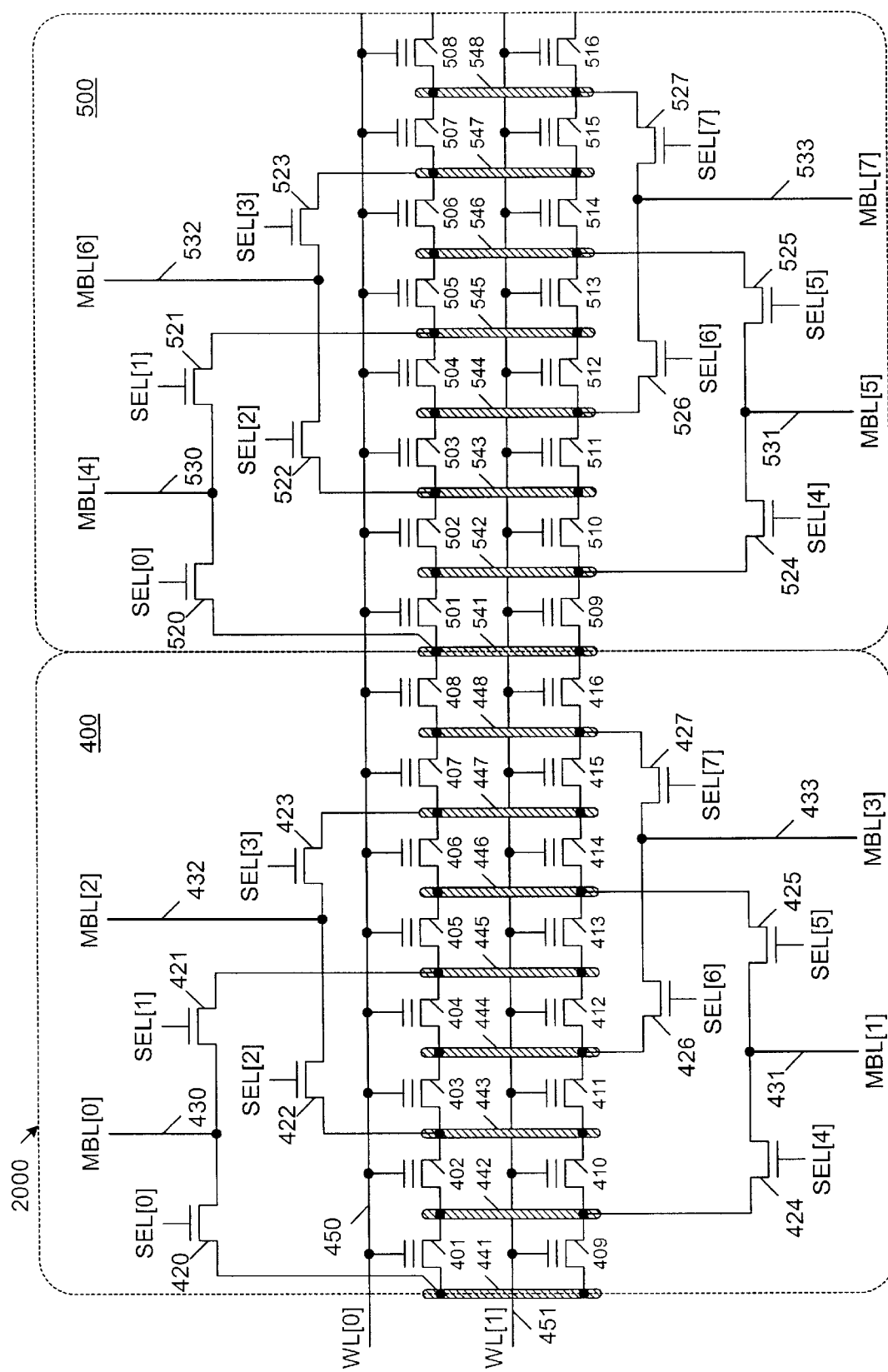
FIG. 4 is a circuit diagram of a symmetrical non-volatile memory array in accordance with another embodiment of the present invention.
Figure 5:
FIG. 5 is a table that defines bit line voltages and select voltages used to read non-volatile memory transistors of the array of FIG. 4 in accordance with one embodiment of the present invention.

FIG. 4 is a circuit diagram of a symmetrical non-volatile memory array 2000 in accordance with another embodiment of the present invention. Array 2000 includes a pair of repeatable memory tiles 400 and 500. Memory tile 400 includes non-volatile memory transistors 401–416, select transistors 420–427, metal bit lines 430–433, and diffusion bit lines 441–448. Similarly, memory tile 500 includes non-volatile memory transistors 501–516, select transistors 520–527, metal bit lines 530–533, and diffusion bit lines 541–548. Memory tiles 400 and 500 share word lines 450–451 and diffusion bit line 541. The construction of memory tiles 400 and 500 is identical. Thus, array 2000 can easily be expanded along the horizontal and vertical axes of FIG. 4 in the same manner described above for array 1000 of FIG. 2. Nonvolatile memory transistors 401–408 and 501–508 are located in a first row of array 2000. The control gates of transistors 401–408 and 501–508 are coupled to word line 450. Nonvolatile memory transistors 409–416 and 509–516 are located in a second row of array 2000. The control gates of transistors 409–416 and 509–516 are coupled to word line 451. Nonvolatile memory transistors 401–416 and 501–516 are substantially identical to non-volatile memory transistors 201–212 and 301–312 (FIG. 2) in the described embodiment.

Non-volatile memory array 2000 is fabricated in a semi-conductor substrate. Diffusion bit lines 441–448 and 541–548 are formed by conductively doping regions of the semiconductor substrate. Diffusion bit lines 441–448 and 541–548 are similar to diffusion bit lines 241–246 and 341–346 of FIG. 2.

Select transistors 420–427 and 520–527, which are fabricated in the semiconductor substrate, are used to couple diffusion bit lines 441–448 and 541–548 to metal bit lines 430–433 and 530–533. More specifically, within memory tile 400, select transistors 420 and 421 couple diffusion bit lines 441 and 445, respectively, to metal bit line 430. Similarly, select transistors 422 and 423 couple diffusion bit lines 443 and 447, respectively, to metal bit line 432. Select transistors 424 and 425 couple diffusion bit lines 442 and 446, respectively, to metal bit line 431. Finally, select transistors 426 and 427 couple diffusion bit lines 444 and 448, respectively, to metal bit line 433. Similar connections are provided between metal bit lines 530–533 and diffusion bit lines 541–548 in memory tile 500. In this manner, each metal bit line is capable of being coupled to a first diffusion bit line, and a second diffusion bit line that is separated from the first diffusion bit line by three other diffusion bit lines.

A non-volatile memory transistor in array 2000 is read in the same manner as a non-volatile memory transistor in array 1000. For example, non-volatile memory transistor 406 is read as follows. A logic high read voltage ($V_{WL}$) is applied to word line 450, and a logic low voltage, such as ground, is applied to word line 451. The select signals SEL[1], SEL[3] and SEL[5] are all asserted high, thereby turning on select transistors 421, 423 and 425. A source read voltage Vs is applied to metal bit line 432 as the MBL[2] signal. The source read voltage Vs is thereby applied to the source of transistor 406 through select transistor 423.

A drain read voltage Vd is applied to metal bit line 431 as the MBL[1] signal. The drain read voltage Vd is thereby applied to the drain of transistor 406 through select transistor 425. In addition, a forcing voltage Vf is applied to metal bit lines 430 as the MBL[0] signal. The forcing voltage Vf is thereby applied to the drain of transistor 405 through select transistor 421. Metal bit lines 433 and 530–533 are left floating in the present example. Under these conditions, non-volatile memory transistor 406 is read in the manner described above.

In this manner, conditions for sensing the read current through transistors in array 2000 are provided without requiring pre-charge or pre-discharge of the diffusion bit lines in array 2000. As a result, the time required for sensing the state of a transistor during a read operation is significantly reduced in comparison with prior art arrays.

In accordance with another embodiment, array 2000 is operated using two forcing voltages. Thus, in addition to applying the forcing voltage Vf to the drain of a first adjacent transistor, a second forcing voltage Vfs is applied to the source of a second adjacent transistor. For example, to read non-volatile memory transistor 406, the same procedure described above is performed. However, in addition, the select signal SEL[7] is also asserted, thereby turning on select transistor 427. The second forcing voltage Vfs is applied to metal bit line 433 as the MBL[3] signal. The second forcing voltage Vfs is thereby applied to the source of non-volatile memory transistor 407 (through turned on select transistor 427 and diffusion bit line 448). In the described example, the second forcing voltage Vfs is set equal to the source voltage Vs. Thus, in the described example, the second forcing voltage Vfs is set to the ground voltage of about 0 Volts. Because neighboring diffusion bit line 448 is held at the same voltage as diffusion bit line 447, diffusion bit line 448 does not tend to increase or reduce the read current through transistor 406. That is, even if neighboring transistor 407 has a low threshold voltage, no current will flow through this transistor 407 because the source and drain of this transistor are held at the same voltage. In this manner, transistor 406 is protected from the neighbor effect on the source side.

Because there are eight diffusion bit lines in each of tiles 400 and 500, decoding will be relatively uncomplicated in a binary system.

FIG. 4 is a table 450 that defines the voltages MBL[7:0] and SEL[7:0] used to read memory transistors 401–408. Table 450 assumes a logic high word line signal WL[0] and a logic low word line signal WL[1]. Non-volatile memory transistors 409–416 and 501–516 are read in a manner similar to non-volatile memory transistors 401–408. Note that non-volatile memory transistors 508 and 516 cannot be read in the present embodiment, as there is no memory tile coupled to the right side of memory tile 500. However, if a memory tile were coupled to the right side of memory tile 500, then memory transistors 508 and 516 would be read in the same manner as memory transistor 408. The voltages listed in table 450 take into consideration the possible expansion of array 2000 to include memory tiles to the left and right.

Although the invention has been described in connection with several embodiments, it is understood that this invention is not limited to the embodiments disclosed, but is capable of various modifications which would be apparent to a person skilled in the art. For example, although n-channel transistors have been used in the described embodiments, it is understood that p-channel transistors can be used in other embodiments. Combinations of n-channel and p-channel transistors can also be used. In addition, although the present invention has been described in connection with non-volatile memory transistors that each store a single bit of data, it is understood that the invention is also applicable to non-volatile memory transistors, such as those described in commonly owned, co-pending U.S. patent application Ser. No. 09/244,529, and U.S. Pat. Nos. 6,081,456 and 6,181,597, that each store two bits of data. Thus, the invention is limited only by the following claims.

What is claimed is:

1. A method of reading a first non-volatile memory transistor in an array of non-volatile memory transistors, wherein the first non-volatile memory transistor has a drain coupled to a source of a second non-volatile memory transistor, the method comprising:

applying a read voltage to a gate of the first non-volatile memory transistor and a gate of the second non-volatile memory transistor;

applying a source voltage to a source of the first non-volatile memory transistor;

applying a drain voltage to the drain of the first non-volatile memory transistor and the source of the second non-volatile memory transistor; and applying a forcing voltage to a drain of the second non-volatile memory transistor.

2. The method of claim 1, wherein the drain voltage is equal to the forcing voltage.

3. The method of claim 2, wherein the drain voltage and the forcing voltage are about 2 Volts.

4. The method of claim 2, wherein the source voltage is equal to ground.

5. The method of claim 1, wherein the source voltage is equal to ground.

6. The method of claim 1, wherein a third non-volatile memory transistor has a drain coupled to the source of the first non-volatile memory transistor, whereby the source voltage is applied to the drain of the third non-volatile memory transistor, the method further comprising:

applying the read voltage to a gate of the third non-volatile memory transistor; and applying a second forcing voltage to a source of the third non-volatile memory transistor.

7. The method of claim 6, wherein the second forcing voltage is equal to the source voltage.

8. A non-volatile memory array comprising:

a first non-volatile memory transistor having a drain coupled to a first bit line;

a second non-volatile memory transistor having a drain coupled to a second bit line and to a source of the first non-volatile memory transistor;

a third non-volatile memory transistor having a drain coupled to a third bit line and to a source of the second non-volatile memory transistor; and means for applying a forcing voltage to the first bit line, a first read voltage to the second bit line, and a second read voltage to the third bit line to perform a read of the second non-volatile memory transistor.

9. The non-volatile memory array of claim 8, wherein the first bit line comprises:

a first diffusion bit line located in a semiconductor substrate; and a first metal bit line located over the semiconductor substrate and coupled to the first diffusion bit line.

10. The non-volatile memory array of claim 9, wherein the means for applying comprise a first select transistor coupled between the first diffusion bit line and the first metal bit line.

11. The non-volatile memory array of claim 8, further comprising:

a fourth non-volatile memory transistor having a drain coupled to the first bit line;

a fifth non-volatile memory transistor having a drain coupled to the second bit line and to a source of the fourth non-volatile memory transistor; and a sixth non-volatile memory transistor having a drain coupled to the third bit line and to a source of the fifth non-volatile memory transistor.

12. The non-volatile memory array of claim 11, further comprising:

a first select transistor coupling the drain of the first non-volatile memory transistor to the first bit line;

a second select transistor coupling the drain of the fourth non-volatile memory transistor to the first bit line;

a third select transistor coupling the drain of the second non-volatile memory transistor to the second bit line;

a fourth select transistor coupling the drain of the fifth non-volatile memory transistor to the second bit line;

a fifth select transistor coupling the drain of the third non-volatile memory transistor to the third bit line; and a sixth select transistor coupling the drain of the sixth non-volatile memory transistor to the third bit line.

13. The non-volatile memory array of claim 8, further comprising:

a fourth bit line coupled to a source of the third non-volatile memory transistor; and means for applying a second forcing voltage to the fourth bit line to perform a read of the second non-volatile memory transistor.

14. A non-volatile memory architecture comprising:

an array of non-volatile memory transistors arranged in rows and columns;

a first set of bit lines, wherein each of the bit lines in the first set is coupled to the drain of each transistor in one column of the array and the source of each transistor in an adjacent column of the array;

a second set of bit lines; and a plurality of select transistors, wherein each bit line in the second set is coupled to a pair of bit lines in the first set through a dedicated pair of the select transistors, wherein the pair of bit lines in the first set are separated by two other bit lines in the first set.

15. The non-volatile memory architecture of claim 14, further comprising means for applying a forcing voltage, a drain read voltage and a source read voltage to three of the bit lines in the second set during a read operation.

16. The non-volatile memory architecture of claim 14, wherein the architecture includes a plurality of identical tiles.

17. A non-volatile memory architecture comprising:

an array of non-volatile memory transistors arranged in rows and columns;

a first set of bit lines, wherein each of the bit lines in the first set is coupled to the drain of each transistor in one column of the array and the source of each transistor in an adjacent column of the array;

a second set of bit lines; and a plurality of select transistors, wherein each bit line in the second set is coupled to a pair of bit lines in the first set through a dedicated pair of the select transistors, wherein the pair of bit lines in the first set are separated by three other bit lines in the first set.

18. The non-volatile memory architecture of claim 17, further comprising means for applying a first forcing voltage, a second forcing voltage, a drain read voltage and a source read voltage to four of the bit lines in the second set during a read operation.

19. The non-volatile memory architecture of claim 17, wherein the architecture includes a plurality of identical tiles.

* * * * *